(12) United States Patent
Mannheim Astete et al.

(10) Patent No.: US 11,421,852 B2
(45) Date of Patent: Aug. 23, 2022

(54) ILLUMINATED LAMINATE WITH SUPERIOR AESTHETICS AND BRIGHTNESS

(71) Applicant: AGP America S.A., Ciudad de Panama (PA)

(72) Inventors: Mario Arturo Mannheim Astete, Lima (PE); Massimo Michetti, San Salvo (IT); Raghu K. Pendyala, Lima (DE); Andres Fernando Sarmiento Santos, Lima (PE); Ivan Arturo Cornejo, Lima (PE); Gonzalo Rafael Vizcarra Mendoza, Lima (PE); Jorge Ramos, Lima (PE); José Nuñez-Regueiro, Lima (PE); Alexey Krasnov, Canton, MI (US)

(73) Assignee: AGP America S.A., Panama (PA)

( * ) Notice: Subject to any disclaimer, the term of this patent is extended or adjusted under 35 U.S.C. 154(b) by 0 days.

(21) Appl. No.: 17/488,933

(22) Filed: Sep. 29, 2021

(65) Prior Publication Data

US 2022/0018516 A1 Jan. 20, 2022

Related U.S. Application Data

(63) Continuation-in-part of application No. PCT/IB2020/052973, filed on Mar. 28, 2020.
(Continued)

(51) Int. Cl.
*F21V 5/00* (2018.01)
*F21V 5/04* (2006.01)
(Continued)

(52) U.S. Cl.
CPC ............... *F21V 5/04* (2013.01); *F21K 9/232* (2016.08); *H01L 33/005* (2013.01); *H01L 33/44* (2013.01); *F21Y 2115/10* (2016.08)

(58) Field of Classification Search
CPC .......... F21V 5/04; F21K 9/232; H01L 33/005; H01L 33/44
See application file for complete search history.

(56) References Cited

U.S. PATENT DOCUMENTS

2015/0247968 A1* 9/2015 Verrat-Debailleul ........................ G02B 6/0073
362/612
2018/0086028 A1 3/2018 Berard et al.
(Continued)

FOREIGN PATENT DOCUMENTS

WO 2019008494 A1 1/2019

*Primary Examiner* — Gerald J Sufleta, II
(74) *Attorney, Agent, or Firm* — The Morales Law Firm; Joseph L. Morales (57) ABSTRACT

The trend towards increasing the glazed area in automobiles has reduced the potential locations for mounting cabin lighting. This is especially true for vehicles having large panoramic glazing. Attempts to utilize integrated light sources within the glazing have had mixed results. Embedded LEDs in the laminate tend to be too bright for night driving. Edge feed illumination with light dispersing elements on the glass to date have only been able to provide low intensity levels. Both approaches tend to reduce visibility and aesthetics in the off state. The current invention provides a means and a method to produce a laminate which provides bright cabin lighting without compromising the function of the glazing to serve as a window, by creating a light dispersing layer that is substantially invisible when in the off state and very bright in the on state.

29 Claims, 4 Drawing Sheets

Related U.S. Application Data

(60) Provisional application No. 62/846,591, filed on May 10, 2019, provisional application No. 62/826,707, filed on Mar. 29, 2019.

(51) Int. Cl.
| | | |
|---|---|---|
| *F21K 9/232* | (2016.01) | |
| *H01L 33/00* | (2010.01) | |
| *H01L 33/44* | (2010.01) | |
| *F21Y 115/10* | (2016.01) | |

(56) References Cited

U.S. PATENT DOCUMENTS

| | | | |
|---|---|---|---|
| 2018/0312428 A1* | 11/2018 | Vandal | .................... C03C 3/087 |
| 2019/0001629 A1 | 1/2019 | Laluet | |
| 2019/0001870 A1* | 1/2019 | Laluet | ............... B32B 17/10348 |
| 2021/0016640 A1* | 1/2021 | Manz | ................. B32B 17/1077 |

* cited by examiner

ILLUMINATED LAMINATE WITH SUPERIOR AESTHETICS AND BRIGHTNESS

CROSS-REFERENCE TO RELATED APPLICATIONS

The present application claims priority as a continuation-in-part from PCT/IB2020/052973 entitled "Illuminated Laminate with Superior Aesthetics and Brightness" filed on Mar. 28, 2020, which claims priority from U.S. Provisional Applications 62/826,707, filed on Mar. 29, 2019, and 62/846,591, filed on May 10, 2019, all of which are incorporated herein by reference in their entireties.

FIELD OF THE INVENTION

The invention relates to the fields of laminated automotive glazing and automotive lighting.

BACKGROUND OF THE INVENTION

As automotive manufacturers work to meet government regulations for fuel efficiency and emissions, as well as to provide the type of environmentally friendly vehicles that the public is increasingly demanding, reducing weight has been a key strategy. While substituting lighter weight materials has been a big part of the trend, we have also seen a reduction in the average size of most vehicles. As the cabin volume decreases, it can lead to an unpleasant claustrophobic effect. To counter this, manufacturers have been increasing the glazed area of vehicles for several years. The increased viewing area and natural light helps to give the cabin a more open and airier feel.

The panoramic glass roof has seen rapid growth over the last several years where it has become a popular option on new cars. The large panoramic glass roof gives the vehicle an airy and luxurious look. In recent years, on models offered with a panoramic roof option in North American and Europe, the percent of vehicles with this option has been in the 30% to 40% range. In China, the rate has been close to 100% on some models.

A potential problem presented by vehicles with large glass roofs is in the area of cabin lighting. It is often not possible or not practical to mount a light near the center of the roof. Instead, auto makers have been placing lights above the doors, in the footwells, cup holders and at other locations.

LED lighting is being used more and more in automotive applications. From ambient lighting to headlamps, the cost, reliability and intensity or LEDs has reached the point where it is a cost-effective replacement for incandescent and other resistive lighting technologies. Indeed, with a lifetime as long as 50,000 hours, the LEDs may well last much longer than the vehicle.

Efforts to embed LEDs in laminated glass have meet with mixed results. One of the main issues is the high intensity of LEDs intended for general illumination. Due to the small size of the LED die and the difficulty in including any kind of a lens or diffuser in a laminate, the light intensity of the die tends to be very high. This can make night driving difficult for the driver. It would be preferred to have a lower intensity illumination spread over a greater area.

Glass can be used to conduct light. Glass fibers work by bouncing the light of off the walls of the fiber. A flat or bent sheet of glass can be used in the same manner. Signs printed on a transparent substrate and illuminated by a light source introducing light into one of the edges have been known for decades. The printed graphic disperses the light inside of the glass illuminating the graphic. The information on a sign is intended to be viewable under all lighting conditions. The illumination is only to allow the sign to be seen under low lighting conditions. The same approach can be used for general illumination, but a light dispersing layer is still needed. If the light dispersing layer is visible when the device is in the off state, the substrate can no longer serve also as a window.

Edge illumination of the glass can be used to provide for illumination. In this method, the glass functions as a wave guide for the light injected along the edges. The light is decoupled and refracted by microscopic defects in the glass surface produced by a variety of means including chemical and abrasive etching and LASER marking. These methods tend to produce undesirable haze and also weaken the glass.

One promising new technology makes use of optical diffusers suspended in a polymer matrix and printed on the substrate. A serious drawback to the technology is that the organic matrix is subject to degradation over time with exposure to heat, humidity and UV and it is difficult to apply the emulsion to bent glass shapes as the emulsion must be applied after bending as it would be destroyed by the heat of the glass bending process.

It would be desirable to have a method for producing an illuminated laminate without these limitations and drawbacks.

BRIEF SUMMARY OF THE INVENTION

The problems of the prior art are solved by means of a light dispersing layer that is substantially invisible when the lighting means is in the off state. This is accomplished by a number of means. The method disclosed here is related to producing an edge illuminated light dispersing layer in a laminate, which is printed on a flat glass light conducting layer prior to bending. The print is substantially invisible when the lighting means is in the off state. In the on state, the dispersing layer can provide a high level of illumination. In preferred embodiments, the light conducting layer is made from a transparent substrate, comprising a sheet of flat low-iron, high visible light transmission or ultra-clear glass. In another preferred embodiment an anti-reflective coating is applied onto the inner glass layer and in contact with the light dispersing layer to increase total internal reflection inside the glazing and improve illumination brightness of the print.

All of the major float glass suppliers manufacture an ultra-clear glass. The ultra-clear glass does not have the characteristic greenish tint that standard soda-lime glass has. It is produced by removing the naturally occurring iron from the batch. Ultra-clear is widely used for furniture and for solar panels. Using an ultra-clear glass sheet, with a visible light transmission in excess of 90% for the light conducting layer, improves the brightness and efficiency of the laminate.

A light dispersing emulsion is printed on the transparent light conducting substrate to form the light dispersing layer.

The light dispersing emulsion used is similar in composition to the black and silver frits commonly used to print black and silver patterns on automotive glass. Rather than a black pigment or silver, the emulsion used is comprised of about 80% organic carrier with dispersed sub-micron inorganic particles. Thus, to guarantee full suspension in the carrier, the particle size is less than 1 µm. Also, as transparency is required, the percent weight of the particles in the emulsion is less than 10%. The particles may be comprised but are not limited to metallic, ceramic, or composite inorganic particles.

Any suitable carrier that is capable of holding the particles in suspension may be used and burning off during heating while leaving behind little or no residue. A solvent, compatible with the carrier, may be added to adjust the viscosity of the emulsion. Other chemicals may be added to the emulsion to enhance properties such as shelf-life, adhesion, etc.

The preferred particle size range includes but is not limited to less than 350 nm. The preferred shape is spherical; however, particles of any other shape can be employed. It should be understood that while these are the preferred ranges, they in no way represent a limitation upon the ranges that the invention may encompass. Other ranges may provide similar or better results based upon different binders, solvents and shapes not yet discovered without departing from the spirit and intent of the invention.

The method comprises:
1. Providing an emulsion comprised of sub-micron particle optical diffusers suspended in a carrier,
2. Providing a glass substrate,
3. Printing the emulsion onto the glass substrate,
4. Heating the glass substrate with the emulsion to evaporate and burn off the organic components, forming the light dispersing layer
5. Bending the glass, and
6. Laminating the glass.

Examples of various embodiments of the product produced by the method are shown in the figures.

Figure 2:
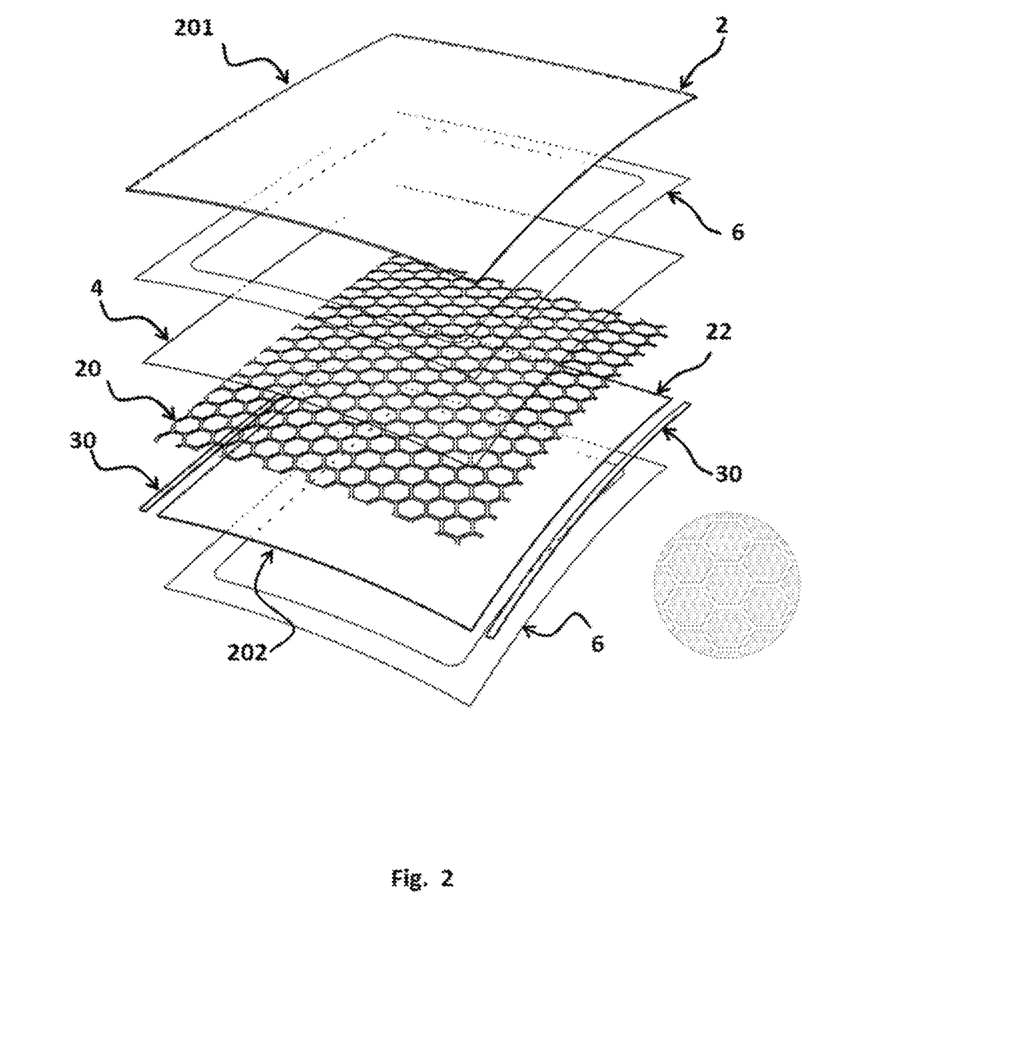
FIG. 2 shows a two-layer illuminated laminate according to an embodiment of the present invention.
Figure 3:
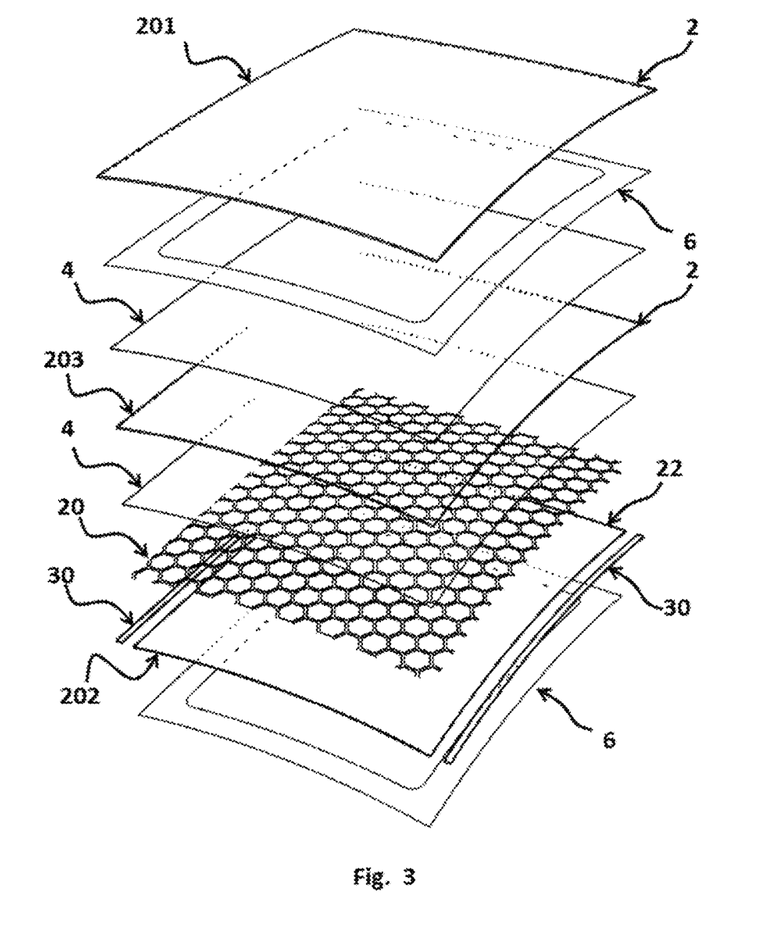
FIG. 3 shows a three-layer illuminated laminate according to an embodiment of the present invention.
Figure 4A:
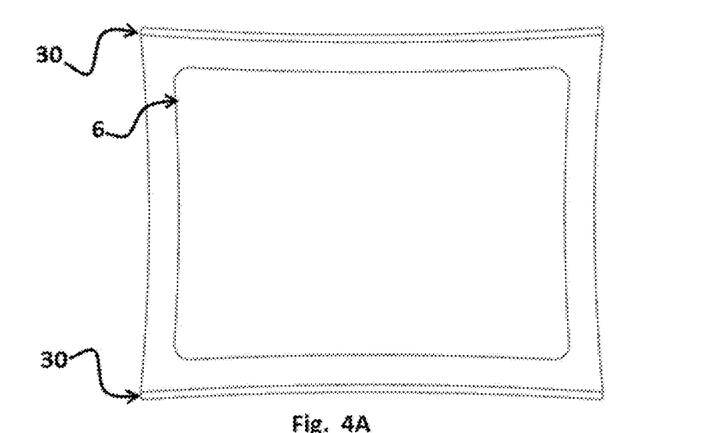
FIG. 4A shows an illuminated laminate in the OFF state.
Figure 4B:
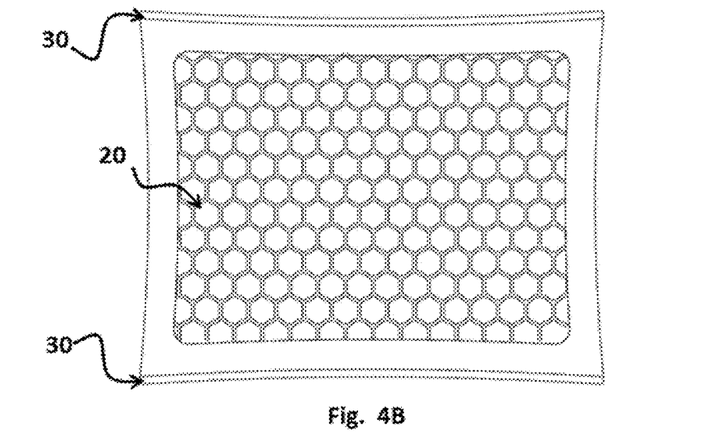
FIG. 4B shows an illuminated laminate in the ON state.

Note that for the hexagon pattern shown in FIGS. 2 and 3, the interior of the hexagon can be printed (as shown) or the space between the hexagons can be printed.

To improve the illumination of the glazing and brightness of the light dispersing layer printed features an anti-reflective coating may be applied to the surface of the inner glass layer in contact with the light dispersing layer. The use of an anti-reflective coating between the glass and plastic interlayer interface has the purpose of matching the refractive index between the plastic interlayer and the inner glass layer so light injected into the edge of the glazing is more efficiently conducted through the glazing instead of being conducted only into the conducting layer. A portion of the light when reaching the interface between glass and plastic interlayer suffers refraction due to the index of refraction mismatch, although minimum, and is lost. When an anti-reflective coating is present, these light losses are minimized at the interface, and it therefore increases the amount of light that interacts with the scattering features present in light dispersing layer. Additionally, an anti-reflective coating may be applied to the interface of at least one additional glass layer and the plastic interlayer. The main advantages of the proposed configurations are that when injecting light into the edge, instead of the injection being limited by the thickness of the light conducting layer, it can actually be done into the light conducting layer with the plastic interlayer or even in the whole glazing. This results in a perceived improved brightness and illumination of the print.

The anti-reflective coating may be comprised of silicon oxynitride such as $SiO_xN_y$. The $SiO_2$ coating has an index of refraction up to 1.48, which is lower than an automotive conventional glass such as soda-lime or aluminosilicate glass. However, when doped with nitrogen its index of refraction is increased reaching up to 2.10. The index of refraction of the anti-reflective coating $SiO_xN_y$ should therefore be tuned to optimally match the plastic interlayer and glass, thus minimizing light losses at the interface between the two materials.

The light dispersing layer must be on one of the inside surfaces of the laminate. That is, one of the surfaces that comes into contact with the PVB. Other plastic interlayer materials may be used without departing from the intent of the invention. As it is well-known (e.g. as taught in patent applications WO2005/054915A1 and WO2012059126A1), preferably the material of the plastic interlayer is selected such that the refractive index of the interlayer is substantially the same as that of the glass sheets. Light which is coupled into the light conducting layer is not reflected at the glass/interlayer interface because the refractive index of the interlayer material is close to that of glass. Interlayer materials, such as polyvinyl butyral (PVB) and ethylene-vinyl acetate (EVA), have a refractive index of approximately 1.49, i.e. approximately the same as the refractive index of the glass sheet.

The defects inherit of the glass sheet due to sheet manipulation and processing may be visually alleviated during the lamination step. The duration, temperature and pressure of the autoclave may need to be increased, depending once again on the interlayer and the nature of the defects.

The PVB will tend to fill the defects, making them all but invisible with the lighting means in the off state and under normal viewing and lighting conditions.

The PVB layer, in order to reduce double image and the amount of light visible from the exterior of the vehicle should have a visible light transmission of no greater than 40%.

The outer glass layer in combination with the interlayer and the light conducting layer should have a visible light transmission of no greater than 20%, preferably less.

To improve homogeneity of the lighting, the lighting means is applied along opposite sides. They can be the front and back or the left and right sides of the laminate. In the embodiments a "light bar" is used. Each is comprised of LED dies in series coupled to a micro lens array for focusing the light on the edge of the light conducting layer. The intensity required has been found to be in the range of at least 400 $cd/m^2$ to obtain a bright light similar in intensity to traditional cabin overhead lighting. In preferred embodiments, the intensity is in the range of at least 500 $cd/m^2$.

The efficiency and the intensity of the emitted light can be further improved by applying a light reflecting coating to at least a portion of the edge of glass that is not used for the light bar. A number of coatings are known that have high reflectance. Also, a thin film may also be applied to the edge or in close proximity to act as a reflector. Highly reflective films have been developed and are in common use in LCD monitors and televisions where they improve the homogeneity and intensity of the backlighting of the LCD cells.

It should be noted that other means of illumination may be used in place of the LEDs of the described embodiments without departing from the concept of the invention. Any means that can provide the intensity and packaging requirements may be utilized including, OLEDs, electro luminescent, fiber optics, light pipes and even means not yet invented.

The light bars are bonded to the edges using an optical adhesive. Optionally, the edges of the light conducting layer may be polished, to increase visible light transmission. The edges may also be ground to a convex, concave or other contour to help focus the light inboard of the edge.

As the LED die acts as point light sources, the distance between the edge of glass and the die should be at least 0.5 mm. The actual spacing will depend upon a number of factors including but not limited to: the light conducting layer edge treatment, the die dimensions, the die intensity, the light bar lens and the light bar diffuser if so equipped.

In the off state, using the printed light dispersing emulsion, haze is under 6% and the drop in visible light transmission is under 10%. Under normal viewing conditions, the print is effectively invisible.

In addition to printing the emulsion onto the glass substrate, other methods can be used, such as:

A chemical etching process in combination with a lithographic mask can be used to create micron scale defects in the glass surface. These defects will disperse the light when illuminated. The entire surface can be treated, or the mask can be created such that a graphic is produced.

In a similar manner, an abrasive process can be used. The glass is first masked off with a durable mask that can protect the glass surface from the abrasive and then the abrasive is directed onto the glass surface. This can be done with the abrasive particles entrained in water or air.

A LASER can also be used to create the micron level defects. This method has the advantage of not requiring a mask. A conventional continuous wave (CW) LASER such as a cutting $CO_2$-source LASER adjusted accordingly can easily and is commonly used to mark glass. The CW LASER however just creates micro cracks in the surface. For very fine small patterns with high definition and for high feed rates, a pico-second pulsed wave LASER is used.

BRIEF DESCRIPTION OF THE SEVERAL VIEWS OF THE DRAWINGS

These features and advantages of the present invention will become apparent from the detailed description of the following embodiments in conjunction with the accompanying drawings, wherein.

REFERENCE NUMERALS OF DRAWINGS

2 Glass Layer
4 Bonding/Adhesive Layer (interlayer)
6 Obscuration/Black Frit
8 Glass Thermally Tempered
12 Film
18 Coating
20 Light dispersing layer
22 Light conducting layer
30 Light bar
101 Surface one
102 Surface two
103 Surface three
104 Surface four
201 Outer layer
202 Inner layer
203 Middle layer

DETAILED DESCRIPTION OF THE INVENTION

The following terminology is used to describe the laminated glazing of the invention.

Figure 1A:
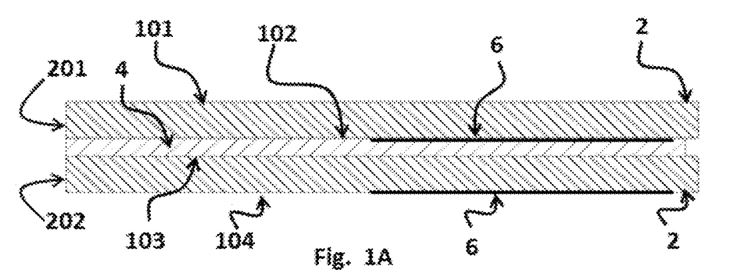
FIG. 1A shows a cross section of a typical laminated automotive glazing.
Figure 1B:
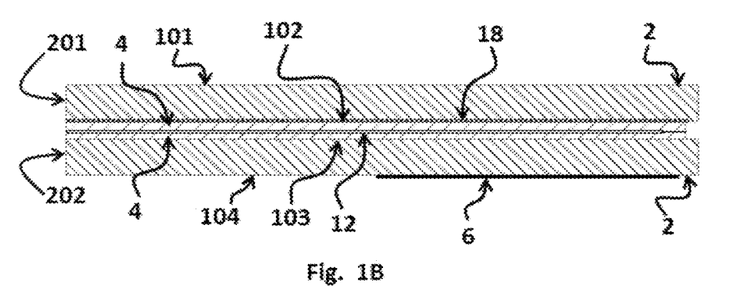
FIG. 1B shows a cross section of a typical laminated glazing with performance film and coating.

Typical automotive laminated glazing cross sections are illustrated in FIGS. 1A and 1B. A laminate is comprised of two layers of glass, the exterior or outer 201 and interior or inner 202 that are permanently bonded together by a plastic layer 4 (interlayer). In a laminate, the glass surface that is on the exterior of the vehicle is referred to as surface one 101 or the number one surface. The opposite face of the exterior glass layer 201 is surface two 102 or the number two surface. The glass 2 surface that is on the interior of the vehicle is referred to as surface four 104 or the number four surface. The opposite face of the interior layer of glass 202 is surface three 103 or the number three surface. Surfaces two 102 and three 103 are bonded together by the plastic layer 4. An obscuration 6 may be also applied to the glass. Obscurations are commonly comprised of black enamel frit printed on either the number two 102 or number four surface 104 or on both. The laminate may have a coating 18 on one or more of the surfaces. The laminate may also comprise a film 12 laminated between at least two plastic layers 4.

Figure 1C:
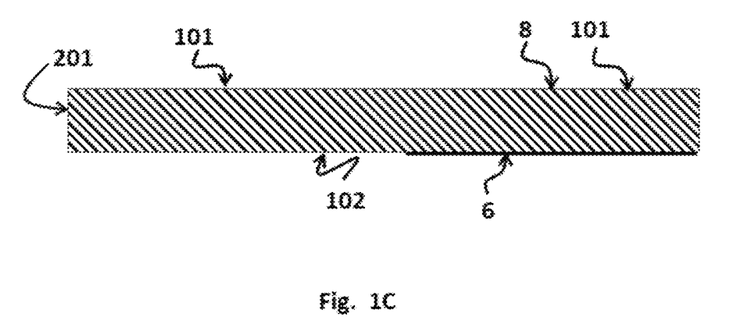
FIG. 1C shows a cross section of a typical tempered monolithic automotive glazing.

FIG. 1C shows a typical tempered automotive glazing cross section. Tempered glazing is typically comprised of a single layer of glass 201 which has been heat strengthened. The glass surface that is on the exterior of the vehicle is referred to as surface one 101 or the number one surface. The opposite face of the exterior glass layer 201 is surface two 102 or the number two surface. The number two surface 102 of a tempered glazing is on the interior of the vehicle. An obscuration 6 may be also applied to the glass. Obscurations are commonly comprised of black enamel frit printed on the number two surface 102. The glazing may have a coating 18 on any one of the surfaces such as the number one 101, number two surface 102, number three surface 103 or number four surface 104 according to their functionality.

The term "glass" can be applied to many organic and inorganic materials, include many that are not transparent. For this document we will only be referring to nonorganic transparent glass. From a scientific standpoint, glass is defined as a state of matter comprising a non-crystalline amorphous solid that lacks the ordered molecular structure of true solids. Glasses have the mechanical rigidity of crystals with the random structure of liquids.

The types of glass that may be used include but are not limited to: the common soda-lime variety typical of automotive glazing as well as aluminosilicate, lithium aluminosilicate, borosilicate, glass ceramics, and the various other inorganic solid amorphous compositions which undergo a glass transition and are classified as glass included those that are not transparent. The glass layers may be comprised of heat absorbing glass compositions as well as infrared reflecting and other types of coatings.

The cross section or stack of a glazing is a list of the layers of a glazing including the position, the material composition and thickness of each. The cross section may also include coatings and any other relevant information.

Example 1

Outer: 2.3 mm annealed solar green
Interlayer: 0.76 mm clear PVB
Inner: 2.3 mm annealed clear

Example 2

Outer: 2.3 mm, press bent coated, clear, annealed, soda-lime glass with ground edge
Interlayer: 0.76 mm 20% blue PVB
Inner: 0.7 mm, flat, clear, chemically tempered, alumino-silicate glass with LASER cut edge Laminates, in general, are articles comprised of multiple sheets of thin, relative to their length and width, material, with each thin sheet having two oppositely disposed major faces and typically of relatively uniform thickness, which are permanently bonded to one and other across at least one major face of each sheet.

Laminated safety glass is made by bonding two sheets (201 & 202) of annealed glass 2 together using a plastic bonding layer comprised of a thin sheet of transparent thermoplastic 4 (interlayer) as shown in FIGS. 1A and 1B.

Annealed glass is glass that has been slowly cooled from the bending temperature down through the glass transition range. This process relieves any stress left in the glass from the bending process. Annealed glass breaks into large shards with sharp edges. When laminated glass breaks, the shards of broken glass are held together, much like the pieces of a jigsaw puzzle, by the plastic layer helping to maintain the structural integrity of the glass. A vehicle with a broken windshield can still be operated. The plastic layer 4 also helps to prevent penetration by objects striking the laminate from the exterior and in the event of a crash occupant retention is improved.

The glass layers may be annealed or strengthened. There are two processes that can be used to increase the strength of glass. They are thermal strengthening, in which the hot glass is rapidly cooled (quenched) and chemical tempering which achieves the same effect through an ion exchange chemical treatment.

Heat strengthened, full temper soda-lime float glass, with a compressive strength in the range of at least 70 MPa, can be used in all vehicle positions other than the windshield. Heat strengthened (tempered) glass has a layer of high compression on the outside surfaces of the glass, balanced by tension on the inside of the glass which is produced by the rapid cooling of the hot softened glass. When tempered glass breaks, the tension and compression are no longer in balance and the glass breaks into small beads with dull edges. Tempered glass is much stronger than annealed laminated glass. The thickness limits of the typical automotive heat strengthening process are in the 3.2 mm to 3.6 mm range. This is due to the rapid heat transfer that is required. It is not possible to achieve the high surface compression needed with thinner glass using the typical blower type low pressure air quenching systems.

A wide range of coatings, used to enhance the performance and properties of glass, are available and in common use. These include but are not limited to anti-reflective, hydrophobic, hydrophilic, self-healing, self-cleaning, anti-bacterial, anti-scratch, anti-graffiti, anti-fingerprint and anti-glare.

Methods of application of these coatings include Magnetron Sputtered Vacuum Deposition (MSVD) as well as others known in the art that are applied via pyrolytic, spray, controlled vapor deposition (CVD), dip, sol-gel and other methods.

Most coatings fall into one of two groups: hard coats and soft coats. Hard coats are durable and can be exposed to weather and touch. Soft coats are easily damaged by touch and exposure. Soft coats are generally protected by applying to one of the enclosed surfaces of an insulated glass unit or, in a laminate, to one of the major faces adjacent to the plastic bonding layer.

The glass layers are formed using gravity bending, press bending, cold bending or any other conventional means known in the art. In the gravity bending process, the glass flat is supported near the edge of glass and then heated. The hot glass sags to the desired shape under the force of gravity. With press bending, the flat glass is heated and then bent on a full of partial surface mold. Air pressure and vacuum are often used to assist the bending process. Gravity and press bending methods for forming glass are well known in the art and will not be discussed in detail in the present disclosure.

The plastic bonding layer 4 (interlayer) has the primary function of bonding the major faces of adjacent layers to each other. The material selected is typically a clear thermoset plastic.

For automotive use, the most commonly used bonding layer 4 (interlayer) is polyvinyl butyral (PVB). PVB has excellent adhesion to glass and is optically clear once laminated. It is produced by the reaction between polyvinyl alcohol and n-butyraldehyde. PVB is clear and has high adhesion to glass. However, PVB by itself, it is too brittle. Plasticizers must be added to make the material flexible and to give it the ability to dissipate energy over a wide range over the temperature range required for an automobile. Only a small number of plasticizers are used. They are typically linear dicarboxylic esters. Two in common use are di-n-hexyl adipate and tetra-ethylene glycol di-n-heptanoate. A typical automotive PVB interlayer is comprised of 30-40% plasticizer by weight.

In addition to polyvinyl butyl, ionoplast polymers, ethylene vinyl acetate (EVA), cast in place (CIP) liquid resin and thermoplastic polyurethane (TPU) can also be used. Automotive interlayers are made by an extrusion process with has a thickness tolerance and process variation. As a smooth surface tends to stick to the glass, making it difficult to position on the glass and to trap air, to facilitate the handling of the plastic sheet and the removal or air (deairing) from the laminate, the surface of the plastic is normally embossed contributing additional variation to the sheet. Standard thicknesses for automotive PVB interlayer at 0.38 mm and 0.76 mm (15 and 30 mil).

Interlayers are available with enhanced capabilities beyond bonding the glass layers together. The invention may include interlayers designed to dampen sound. Such interlayers are comprised whole or in part of a layer of plastic that is softer and more flexible than that normally used. The interlayer may also be of a type which has solar attenuating properties.

A wide variety of films are available that can be incorporated into a laminate. The uses for these films include but are not limited to: solar control, variable light transmission, increased stiffness, increased structural integrity, improved penetration resistance, improved occupant retention, providing a barrier, tint, providing a sunshade, color correction, and as a substrate for functional and aesthetic graphics. The term "film" shall include these as well as other products that may be developed or which are currently available which enhance the performance, function, aesthetics or cost of a laminated glazing. Most films do not have adhesive properties. To incorporate into a laminate, sheets of plastic interlayer are needed on each side of the film to bond the film to the other layers of the laminate.

Automotive glazing often makes use of heat absorbing glass compositions to reduce the solar load on the vehicle. While a heat absorbing window can be very effective the glass will heat up and transfer energy to the passenger compartment through convective transfer and radiation. A more efficient method is to reflect the heat back to the atmosphere allowing the glass to stay cooler. This is done using various infrared reflecting films and coatings. Infrared coatings and films are generally too soft to be mounted or applied to a glass surface exposed to the elements. Instead, they must be fabricated as one of the internal layers of a laminated product to prevent damage and degradation of the film or coating.

One of the big advantages of a laminated window over a tempered monolithic glazing is that a laminate can make use of infrared reflecting coatings and films in addition to heat absorbing compositions and interlayers.

Infrared reflecting coatings include but are not limited to the various metal/dielectric layered coatings applied though Magnetron Sputtered Vacuum Deposition (MSVD) as well as others known in the art that are applied via pyrolytic, spray, controlled vapor deposition (CVD), dip and other methods.

Infrared reflecting films include both metallic coated plastic substrates as well as organic based non-metallic optical films which reflect in the infrared. Most of the infrared reflecting films are comprised of a plastic film substrate having an infrared reflecting layered metallic coating applied.

DESCRIPTION OF EMBODIMENTS PRODUCED BY THE METHOD

1. Embodiment 1, illustrated in FIG. 2, is comprised of a 3.6 mm outer layer 201 of full temper solar green soda-lime glass with a black enamel frit 6 printed on the number two surface. A gray tint PVB 4 with a visible light transmission of 40% is used to bond the outer glass layer 201 to the 2.1 mm low iron, soda-lime light conducting layer 22 having a visible light transmission of 92%. A hexagon light dispersing layer 20 is printed on the number three surface of the laminate using an emulsion comprised of 10% by weight of inorganic sub-micron particles having a size substantially in the range of less than 350 nm, on the light conducting layer 22 surface. The emulsion is printed on the flat glass prior to bending. The flat printed glass is then heated to a temperature where the viscosity of the glass sheet is in the range of $10^{12.5}$ Poise to $10^{9.5}$ Poise, driving off the solvent and burning off the carrier, leaving behind a thin layer of inorganic particles. The light conducting layer 22 also has a black enamel frit band 6 printed on the number four surface. Light bar 30, comprising several LED dies wherein each are optically bonded to the left and right edges of the laminate. The edges of the light conducting layer 22 are ground to a convex profile and polished to facilitate the entry of light from the light bar 30. The light bar 30 has an intensity no more than 500 cd/m² and are also provided with a micro lens array (not shown) to direct and focus the light. RGB LEDs are used allowing the laminate to be illuminated in a wide range of colors. The total visible light transmission of the laminate is 20%. An extended autoclave cycle is used to allow the PVB 4 to flow into the micro-defects. The treated area is substantially invisible with the light bar 30 in the off state.

2. Embodiment 2, illustrated in FIG. 3, is comprised of a 2.1 mm outer layer 201 of annealed, solar green, soda-lime glass with a black enamel frit 6 printed on the number two surface. A clear PVB interlayer 4 is used to bond the outer glass layer 201 to a 2.1 mm middle layer 203 of annealed, solar green, soda-lime glass. A gray tint PVB 4 with a visible light transmission of 40% is used to bond the middle glass layer 203 to the 2.1 mm low iron, soda-lime light conducting layer 22 having a visible light transmission of 92%. A hexagon light dispersing layer 20 is printed on the major surface of the light conducting layer 22 that faces inwardly of the laminate using an emulsion comprised of sub-micron particles and cured as demonstrated in embodiment 1. The light conducting layer 22 also has a black enamel frit band 6 printed on the number four surface. Light bars 30, comprises several LED dies wherein each are optically bonded to the left and right edges of the laminate. The edges of the light conducting layer 22 are ground to a convex profile and polished to facilitate the entry of light from the light bars. The light bars have an intensity greater than 500 cd/m² and are also provided with a micro lens array (not shown) to direct and focus the light. RGB LEDs are used allowing the laminate to be illuminated in a wide range of colors. The total visible light transmission of the laminate is 20%. An extended autoclave cycle is used to allow the PVB 4 to flow into the micro-defects. The treated area is substantially invisible with the light bars 30 in the off state.

3. Embodiment three is similar to embodiment 1 with the addition of an anti-reflective coating composed of silicon oxynitride having an index of refraction that matches the glass and the plastic interlayer and applied to the light conducting layer.

4. Embodiment three is similar to embodiment 3 with the exception of the plastic interlayer. Instead of a grey PVB, a clear PVB with visible light transmittance above 90% is used to laminate the glazing. An additional anti-reflective coating layer composed of silicon oxynitride and having an index of refraction that matches the glass is applied to the internal surface of the outer glass layer which is in contact with the PVB.

In addition, in some embodiments, a dielectric mirror coating (not shown in figures) is disposed on the outer glass layer in order to enhance the light output and the UV protection. Likewise, in additional embodiments, the dielectric mirror coating comprises at least one layer of silver in order to reflect infrared radiation.

What is claimed is:
1. A method for producing an illuminated curved automotive laminate with superior aesthetics and brightness comprising:
providing an emulsion comprised of an organic material with dispersed sub-micron inorganic particles having an average particle size that is no greater than 1 μm;
providing a light conducting layer, wherein said light conducting layer is a glass layer;
printing the emulsion onto a main surface of the light conducting layer;
curing the emulsion by heating the glass layer with the emulsion to evaporate and burn off the organic material forming a light dispersing layer;

providing at least one additional glass layer;
bending at least said one additional glass layer;
providing at least one plastic interlayer;
disposing the light conducting layer with the light dispersing layer in contact with said at least one plastic interlayer;
laminating the light conducting layer with the light dispersing layer and said at least one plastic interlayer;
placing at least two lighting means and aligning them with opposite edges of said light conducting layer.

2. The method of claim 1 wherein said at least one plastic interlayer comprises a tinted plastic interlayer having a visible light transmission of 40% or less.

3. The method of claim 1 wherein the glass layer is a light conducting layer having a total visible light transmission of at least 90%.

4. The method of claim 1 wherein the additional glass layer is selected such that the total visible light transmission of the laminate is no greater than 5%.

5. The method of claim 1 wherein the light dispersing layer comprises a graphic.

6. The method of claim 1 wherein the sub-micron inorganic particles are optical diffuser particles having an average size that is preferably no greater than 350 nm, more preferably no greater than 100 nm.

7. The method of claim 1 wherein the percent weight of the sub-micron inorganic particles in the emulsion is less than 10%.

8. The method of claim 1 wherein the emulsion is cured by heating the glass substrate of the light conducting layer to a temperature at which the viscosity of the glass is in the range of $10^{12.5}$ to $10^{9.5}$ Poise.

9. The method of claim 1 wherein the emulsion is cured by heating the glass substrate of the light conducting layer to a temperature at which the viscosity of the glass is in the range of $10^{12.5}$ to $10^{10.5}$ Poise.

10. The method of claim 1 wherein said light conducting layer is cold bent.

11. The method of claim 1 wherein in the step of placing at least two lighting means, these lighting means have two operation mode states: on and off; and after the lamination step the light dispersing layer generates an increase in haze of no more than 6% making this layer substantially invisible when said automotive laminate is in off state.

12. The method of claim 1 further comprising the step of bending the light conducting layer.

13. The method of claim 12 wherein the light conducting layer bending and curing steps occur at the same time.

14. An illuminated curved automotive laminate with superior aesthetics and brightness comprising:
a light conducting layer made of glass;
at least one additional glass layer;
at least two lighting means placed and aligned with opposite edges of said light conducting layer;
at least one plastic interlayer placed between the light conducting layer and said at least one additional glass layer; and
a light dispersing layer made of sub-micron inorganic particles, having an average particle size that is no greater than 1 μm, which is printed onto a main surface of the light conducting layer;
wherein the light dispersing layer is in contact with said at least one plastic interlayer.

15. The laminate of claim 14 wherein said at least two lighting means comprises at least two light bars, each light bar is comprised of LED dies disposed at a distance of at least 0.5 mm from the edge of the glass.

16. The laminate of claim 14 further comprising a light reflecting coating applied to at least a portion of the edges of the light conducting layer that are free of the lighting means.

17. The laminate of claim 14 wherein said at least two lighting means have two operation mode states: on and off, and wherein the plastic interlayer in contact with the light dispersing layer is a tinted polyvinyl butyral interlayer which interacts with the light dispersing layer, making them substantially invisible with the lighting means in the off state and under normal viewing and lighting conditions.

18. The laminate of claim 14 wherein one of the interior surface of the laminate is treated with a low-E coating.

19. The laminate of claim 14 wherein at least one of the interior surfaces of the laminate is treated with an anti-reflective coating.

20. The laminate of claim 19 wherein the anti-reflective coating is composed of silicon oxynitride.

21. The laminate of claim 19 wherein the anti-reflective coating has an index of refraction matching the glass layer in contact with the coating.

22. The laminate of claim 19 wherein the anti-reflective coating has an index of refraction matching the glass layer and plastic interlayer in contact with the coating.

23. The laminate of claim 14 wherein the interior surface of the laminate interior to the vehicle is treated with a low-E coating.

24. The laminate of claim 14 wherein the surface of the laminate facing the interior of the vehicle is treated with an anti-reflective coating.

25. The laminate of claim 14 wherein an IR reflecting film or coating is included in the laminate stack between said at least one additional glass layer and the light dispersing layer.

26. The laminate of claim 14 wherein the lighting means is provided with a lens.

27. The laminate of claim 14 wherein the edges of the light conducting layer are ground to form a lens.

28. The laminate of claim 14 further comprising a dielectric mirror coating disposed on an additional layer of said at least one additional glass layer.

29. The laminate of claim 28 wherein the dielectric mirror coating comprises at least one layer of silver.

* * * * *